United States Patent
Wang et al.

(10) Patent No.: US 9,893,206 B2
(45) Date of Patent: Feb. 13, 2018

(54) THIN FILM TRANSISTOR, ARRAY SUBSTRATE, THEIR MANUFACTURING METHODS, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yuliang Wang, Beijing (CN); Daeyoung Choi, Beijing (CN); Zengli Liu, Beijing (CN); Daojie Li, Beijing (CN); Fei Al, Beijing (CN); Jun Zhou, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/146,643

(22) Filed: May 4, 2016

(65) Prior Publication Data

US 2016/0351726 A1 Dec. 1, 2016

(30) Foreign Application Priority Data

May 29, 2015 (CN) .......................... 2015 1 0289827

(51) Int. Cl.
*H01L 29/10* (2006.01)
*H01L 29/786* (2006.01)
(Continued)

(52) U.S. Cl.
CPC .. *H01L 29/78696* (2013.01); *H01L 21/32134* (2013.01); *H01L 29/458* (2013.01); *H01L 29/66765* (2013.01); *H01L 29/78669* (2013.01)

(58) Field of Classification Search
CPC ... H01L 29/786; H01L 29/45; H01L 21/3213; H01L 29/66
(Continued)

(56) References Cited

U.S. PATENT DOCUMENTS 8,441,012 B2 * 5/2013 Juhmonji ............... H01L 27/124
257/208
9,165,947 B2 * 10/2015 Yan ..................... H01L 27/1225
(Continued)

FOREIGN PATENT DOCUMENTS

| CN | 101179029 A | 5/2008 |
|---|---|---|
| CN | 103187451 A | 7/2013 |
| CN | 104600123 A | 5/2015 |

OTHER PUBLICATIONS

First Office Action for Chinese Application No. 201510289827.3, dated Jun. 16, 2017, 9 Pages.

*Primary Examiner* — Caleb Henry
(74) *Attorney, Agent, or Firm* — Brooks Kushman P.C.

(57) ABSTRACT

The present disclosure provides a TFT, an array substrate, their manufacturing methods, and a display device. A source electrode and a drain electrode of the TFT are each of a multi-layered structure including a metal layer and a metal barrier layer. An a-Si active layer of the TFT is covered with an etch stop layer, via-holes penetrating through the etch stop layer are provided at positions corresponding to the source electrode and the drain, and the source electrode and the drain electrode are connected to the a-Si active layer through the via-holes.

20 Claims, 3 Drawing Sheets

(51) Int. Cl.
*H01L 29/66* (2006.01)
*H01L 29/45* (2006.01)
*H01L 21/3213* (2006.01)

(58) Field of Classification Search
USPC .......................................................... 257/43
See application file for complete search history.

(56) References Cited

U.S. PATENT DOCUMENTS

| | | | |
|---|---|---|---|
| 9,368,518 B2* | 6/2016 | Lee | H01L 27/1225 |
| 2002/0000557 A1* | 1/2002 | Kido | H01L 21/0274 |
| | | | 257/66 |
| 2009/0321731 A1* | 12/2009 | Jeong | H01L 29/4908 |
| | | | 257/43 |
| 2012/0146018 A1* | 6/2012 | Schneider-Betz | H01L 29/7869 |
| | | | 257/43 |
| 2012/0206685 A1 | 8/2012 | Takasawa et al. | |
| 2012/0261755 A1* | 10/2012 | Chen | H01L 29/458 |
| | | | 257/347 |
| 2015/0048359 A1* | 2/2015 | Fukase | H01L 29/511 |
| | | | 257/43 |
| 2016/0027931 A1* | 1/2016 | Zhang | H01L 27/1225 |
| | | | 257/43 |
| 2016/0372603 A1 | 12/2016 | Liu et al. | |

* cited by examiner

THIN FILM TRANSISTOR, ARRAY SUBSTRATE, THEIR MANUFACTURING METHODS, AND DISPLAY DEVICE

CROSS-REFERENCE TO RELATED APPLICATION

The present application claims a priority of the Chinese Patent Application No. 201510289827.3 filed on May 29, 2015, which is incorporated herein by reference in its entirety.

TECHNICAL FIELD

The present disclosure relates to the field of display technology, in particular to a thin film transistor (TFT), an array substrate, their manufacturing methods, and a display device.

BACKGROUND

Along with the increase of the size of the thin film transistor liquid crystal display (TFT-LCD), uneven display will occur due to an IR-drop in the case that an electrode and a signal transmission line of the display each have a relatively large resistance. Hence, the signal transmission line and the electrode need to be made of a material having low resistivity, and usually a wire for the display is made of Cu.

In the case that the signal transmission line and the electrode are made of Cu, Cu atoms therein may easily be diffused into an insulation layer, thereby an insulation characteristic of the insulation layer may be adversely affected. At this time, usually a metal barrier layer needs to be provided, so as to prevent the diffusion of Cu. However, during the manufacture of an array substrate, an etchant for etching the metal barrier layer may destroy a semiconductor layer of the TFT, and as a result, the image quality of the display will be adversely affected.

SUMMARY

An object of the present disclosure is to provide a TFT, an array substrate, their manufacturing methods, and a display device, so as to prevent a semiconductor layer from being adversely affected by an etchant in the case that a metal barrier layer on the semiconductor layer is etched.

In one aspect, the present disclosure provides in some embodiments a TFT. A source electrode and a drain electrode of the TFT are each of a first multi-layered structure including a first metal layer and a first metal barrier layer. An a-Si active layer of the TFT is covered with an etch stop layer, via-holes penetrating through the etch stop layer are provided at positions corresponding to the source electrode and the drain electrode, and the source electrode and the drain electrode are connected to the a-Si active layer through the via-holes.

Alternatively, a gate electrode of the TFT is of a second multi-layered structure including a second metal layer and a second metal barrier layer, which are made of materials identical to the first metal layer and the first metal barrier layer respectively.

Alternatively, the first multi-layered structure is a double-layered structure consisting of the metal layer and the metal barrier layer, and the second multi-layered structure is a double-layered structure consisting of the second metal layer and the second metal barrier layer.

Alternatively, the first multi-layered structure is a triple-layered structure consisting of, one on top of the other, the first metal barrier layer, the first metal layer and a third layer made of Mo, Ti or Ta, and the second multi-layered structure is a triple-layered structure consisting of, one on top of the other, the second metal barrier layer, the second metal layer and a third layer made of Mo, Ti or Ta.

Alternatively, the first metal layer is made of Cu.

Alternatively, the first metal barrier layer is made of Ti, Mo or an alloy of Mo and Nb.

Alternatively, the a-Si active layer includes an a-Si layer and an n+a-Si layer arranged on the a-Si layer.

Alternatively, the n+a-Si layer is made of P-doped Si,

In another aspect, the present disclosure provides in some embodiments an array substrate, including a base substrate and the above-mentioned TFT formed on the base substrate.

Alternatively, a data line and/or a gate line of the array substrate are each of a third multi-layered structure including a third metal layer and a third metal barrier which are made of materials identical to the first meal layer and the first metal barrier layer respectively.

In yet another aspect, the present disclosure provides in some embodiments a display device including the above-mentioned array substrate.

In still yet another aspect, the present disclosure provides in some embodiments a method for manufacturing a TFT, including steps of: forming a pattern of an etch stop layer on an a-Si active layer of the TFT, via-holes penetrating through the etch stop layer being provided at positions corresponding to a source electrode and a drain electrode of the TFT; and forming the source electrode and the drain electrode of the TFT using a first multi-layered structure including a first metal layer and a first metal barrier layer, the source electrode and the drain electrode being connected to the a-Si active layer through the via-holes respectively.

Alternatively, the method further includes forming a gate electrode of the TFT using a second multi-layered structure including a second metal layer and a second metal barrier layer, which are made of materials identical to the first metal layer and the first metal barrier layer respectively.

Alternatively, the step of forming the a-Si active layer, the source electrode and the drain electrode includes: forming a double-layered structure consisting of an a-Si layer and an n+a-Si layer, and patterning the double-layered structure to form a pattern of the a-Si active layer; forming the etch stop layer on a-Si active layer, and patterning the etch stop layer to form the via-holes penetrating through the etch stop layer at positions corresponding to the source electrode and the drain electrode; and depositing the first multi-layered structure including the first metal layer and the first metal barrier layer onto the etch stop layer, applying a photoresist onto the first multi-layered structure, exposing and developing the photoresist to form a photoresist reserved region and a photoresist unreserved region, and etching the first multi-layered structure at the photoresist unreserved region with an HF-containing $H_2O_2$ etchant to form the source electrode and the drain electrode, which are connected to the a-Si active layer through the via-holes.

Alternatively, subsequent to the step of forming the source electrode and the drain electrode, the method further includes: removing the etch stop layer at a region corresponding to a gap between the source electrode and the drain electrode by a dry-etching process, so as to expose the a-Si active layer at a position corresponding to the region; and etching off the n+a-Si layer and a part of the a-Si layer at the position corresponding to the region, so as to form a channel of the TFT.

Alternatively, the first metal layer is made of Cu, and the first metal barrier layer is made of Ti, Mo, or an alloy of Mo and Nb.

In still yet another aspect, the present disclosure provides in some embodiments a method for manufacturing an array substrate, including a step of forming a TFT on a base substrate using the above-mentioned method.

Alternatively, the method further includes forming a data line and/or a gate line of the array substrate using a third multi-layered structure including a third metal layer and a third metal barrier layer, which are made of materials identical to the first metal layer and the first metal barrier layer respectively.

According to the embodiments of the present disclosure, the etch stop layer is formed on the a-Si active layer. In the case that the metal barrier layer on the a-Si active layer is etched, it is able to protect the a-Si active layer through the etch stop layer and prevent the semiconductor characteristics of the a-Si active layer from being adversely affected by the HF-containing $H_2O_2$ etchant, thereby to ensure the performance of the TFT.

DETAILED DESCRIPTION OF THE EMBODIMENTS

Figure 1:
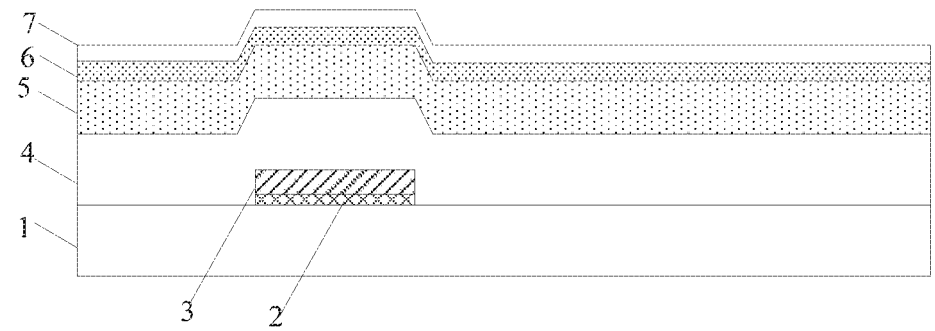
FIG. 1 is a schematic view showing an array substrate after the formation of an etch stop layer according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, usually a metal barrier layer is made of Mo/Nb, and during the manufacture of an array substrate, $H_2O_2$ is used as an etchant for etching Cu. In order to etch Mo/Nb, it is necessary to add HF into the $H_2O_2$ etchant. However, a-Si in a semiconductor layer may be etched by HF. As a result, in the case that the metal barrier layer on the semiconductor layer is etched, the HF-containing $H_2O_2$ etchant may destroy the semiconductor layer, and the image quality of the display will be adversely affected.

The present disclosure provides in some embodiments a TFT, an array substrate, their manufacturing methods, and a display device, so as to prevent a semiconductor layer from being adversely affected by an etchant in the case that a metal barrier layer on the semiconductor layer is etched.

The present disclosure provides in some embodiments a TFT. A source electrode and a drain electrode of the TFT are each of a multi-layered structure (e.g., a first multi-layered structure) including a metal layer (e.g., a first metal layer) and a metal barrier layer (e.g., a first metal barrier layer). An a-Si active layer of the TFT is covered with an etch stop layer, via-holes penetrating through the etch stop layer are provided at positions corresponding to the source electrode and the drain electrode, and the source electrode and the drain electrode are connected to the a-Si active layer through the via-holes.

According to the embodiments of the present disclosure, the etch stop layer is formed on the a-Si active layer. In the case that the metal barrier layer on the a-Si active layer is etched, it is able to protect the a-Si active layer through the etch stop layer and prevent the semiconductor characteristics of the a-Si active layer from being adversely affected by the HF-containing $H_2O_2$ etchant, thereby to ensure the performance of the TFT.

The via-holes penetrating through the etch stop layer may each be of a square or circle shape, or any other shapes, as long as the source electrode and the drain electrode may be connected to the a-Si active layer through the via-holes.

Alternatively, a gate electrode of the TFT may also be of a multi-layered structure (e.g., a second multi-layered structure) including a metal layer (e.g., a second metal layer) and a metal barrier layer (e.g., a second metal barrier layer). This is because, in the case that the gate electrode of the TFT is made of Cu, it is also necessary to provide the metal barrier layer under the gate electrode so as to prevent the diffusion of Cu atoms in the gate electrode into a base substrate.

In an alternative embodiment of the present disclosure, the multi-layered structure may be a double-layered structure consisting of a first layer (i.e., the metal barrier layer) and a second layer (i.e., the metal layer).

In another alternative embodiment of e present disclosure, the multi-layered structure may be a triple-layered structure consisting of, one on top of the other, a first layer (i.e., the metal barrier layer), a second layer (i.e., the metal layer) and a third layer made of Mo, Ti or Ta.

Alternatively, the metal layer is made of Cu with excellent conductivity, and the metal barrier layer is made of a metal or alloy with stable properties, such as Ti, Mo or Mo/Nb.

Further, the a-Si active layer includes an a-Si layer and an n+a-Si layer arranged on the a-Si layer, and the n+a-Si layer is made of P-doped Si. P is reactive and a replacement reaction may easily occur between P and Cu. In order to prevent the performance of the active layer from being adversely affected, it is necessary to add a metal barrier layer between the metal layer and the a-Si active layer.

The present disclosure further provides in some embodiments an array substrate including a base substrate and the above-mentioned TFT formed on the base substrate.

Alternatively, a data line and/or a gate line of the array substrate are each of a multi-layered structure (e.g., a third multi-layered structure) including a metal layer (e.g., a third metal layer) and a metal barrier layer (e.g., a third metal barrier layer). This is because, in the case that the data line and/or the gate line of the array substrate are made of Cu, it is also necessary to provide the metal barrier layer under the data line and/or the gate line, so as to prevent the diffusion of Cu in the data line and/or the gate line into the base substrate.

The present disclosure further provides in some embodiments a display device including the above-mentioned array substrate. The display device may be any product or member having a display function, such as a liquid crystal panel, a liquid crystal television, a liquid crystal display, a digital photo frame, a mobile phone, or a flat-panel computer.

The present disclosure further provides in some embodiments a method for manufacturing a TFT, including steps of: forming a pattern of an etch stop layer on an a-Si active layer of the TFT, via-holes penetrating through the etch stop layer being provided at positions corresponding to a source electrode and a drain electrode of the TFT; and forming the source electrode and the drain electrode of the TFT using a multi-layered structure (e.g., a first multi-layered structure) including a metal layer (e.g., a first metal layer) and a metal barrier layer (e.g., a first metal barrier layer), the source electrode and the drain electrode being connected to the a-Si active layer through the via-holes respectively.

According to the embodiments of the present disclosure, the etch stop layer is formed on the a-Si active layer. In the case that the metal barrier layer on the a-Si active layer is etched, it is able to protect the a-Si active layer through the etch stop layer and prevent the semiconductor characteristics of the a-Si active layer from being adversely affected by the HF-containing $H_2O_2$ etchant, thereby to ensure the performance of the TFT.

The via-holes penetrating through the etch stop layer may be each of a square or circle shape, or any other shapes, as long as the source electrode and the drain electrode may be connected to the a-Si active layer through the via-holes.

Alternatively, the method further includes forming a gate electrode of the TFT using a multi-layered structure (e.g., a second multi-layered structure) including a metal layer (e.g., a second metal layer) and a metal barrier layer (e.g., a second metal barrier layer), which are made of materials identical to the first metal layer and the first metal barrier layer respectively. This is because, in the case that the gate electrode of the TFT is made of Cu, it is also necessary to provide the metal barrier layer under the gate electrode so as to prevent the diffusion of Cu atoms in the gate electrode into a base substrate.

Alternatively, the step of forming the a-Si active layer, the source electrode and the drain electrode includes: forming a double-layered structure consisting of an a-Si layer and an n+a-Si layer, and patterning the double-layered structure to form a pattern of the a-Si active layer; forming the etch stop layer on the a-Si active layer, and patterning the etch stop layer to form the via-holes penetrating through the etch stop layer at positions corresponding to the source electrode and the drain electrode; and depositing the multi-layered structure including the metal layer and the metal barrier layer onto the etch stop layer, applying a photoresist onto the multi-layered structure, exposing and developing the photoresist to form a photoresist reserved region and a photoresist unreserved region, and etching the multi-layered structure at the photoresist unreserved region with an HF-containing $H_2O_2$ etchant to form the source electrode and the drain electrode, which are connected to the a-Si active layer through the via-holes.

The n+a-Si layer is made of P-doped Si. P is relatively reactive, and a replacement reaction may easily occur between P and Cu. In order to prevent the performance of the active layer from being adversely affected, it is necessary to add the metal barrier layer between the metal layer and the a-Si active layer. In the case that the metal barrier layer is etched, an HF-containing $H_2O_2$ etchant needs to be used. In order to prevent the semiconductor characteristics of the a-Si active layer from being adversely affected by the HF-containing $H_2O_2$ etchant, the etch stop layer is formed on the a-Si active layer. In this way, in the case that the metal barrier layer on the a-Si active layer is etched, it is able to protect the a-Si active layer through the etch stop layer, thereby to prevent the semiconductor characteristics of the a-Si active layer from being adversely affected by the HF-containing $H_2O_2$ etchant.

Alternatively, in order to prevent the performance of the TFT from being adversely affected by the etch stop layer, the method further includes, subsequent to the step of forming the source electrode and drain electrode, removing the etch stop layer at a region corresponding to a gap between the source electrode and the drain electrode by a dry-etching process so as to expose the a-Si active layer at a position corresponding to the region, and etching off the n+a-Si layer and a part of the a-Si layer at the position corresponding to the region so as to form a channel of the TFT.

The present disclosure further provides in some embodiments a method for manufacturing an array substrate, including a step of forming a TFT on a base substrate using the above-mentioned method.

Alternatively, the method further includes forming a data line and/or a gate line of the array substrate using a multi-layered structure (e.g., a third multi-layered structure) including a metal layer (e.g., a third metal layer) and a metal barrier layer (e.g., a third metal barrier layer). This is because, in the case that the data line and/or the gate line of the array substrate are made of Cu, it is also necessary to provide the metal barrier layer under the data line and/or the gate line, so as to prevent the diffusion of Cu atoms in the data lien and/or the gate line into the base substrate.

The method for manufacturing the array substrate will be described hereinafter in conjunction with the drawings, and the method may include the following steps.

Step a: providing a base substrate 1, and forming a gate line and a gate electrode of a TFT on the base substrate 1. The base substrate 1 may be a glass or quartz substrate. To be specific, as shown in FIG. 1, a gate metal layer having a thickness of 2500 to 16000 Å may be deposited onto the base substrate 1 by sputtering or thermal evaporation. The gate metal layer may be of a multi-layered structure consisting of two or more layers. In the embodiments of the present disclosure, the gate metal layer may include a Mo/Nb layer 2 and a Cu layer 3, and the Mo/Nb layer 2 may be used to prevent the diffusion of Cu atoms in the Cu layer 3 into the base substrate. A photoresist may be applied onto the gate metal layer, and then exposed with a mask plate, so as to form a photoresist reserved region corresponding to a region where a pattern of the gate metal layer is located, and a photoresist unreserved region corresponding to the other region. Next, the photoresist may be developed, so as to fully remove the photoresist at the photoresist unreserved region and maintain a thickness of the photoresist at the photoresist reserved region. Then, the gate metal layer at the photoresist unreserved region may be fully etched off and the remaining photoresist may be removed, so as to form the pattern of the gate metal layer. The pattern of the gate metal layer includes the gate line and the gate electrode of the TFT.

Step b: forming a gate insulation layer 4 and a pattern of an a-Si active layer on the base substrate 1 obtained after Step a. To be specific, as shown in FIG. 1, the gate insulation layer 4 having a thickness of about 2000 to 6000 Å may be deposited onto the base substrate 1 obtained after Step a by plasma enhanced chemical vapor deposition (PECVD). The gate line and the gate electrode are made of Cu in the embodiments of the present disclosure, and a replacement reaction may easily occur between Si in SiOx and Cu to generate CuO, so in the embodiments of the present disclosure, the gate insulation layer 4 may be made of SiNx. Next, the a-Si active layer having a thickness of about 20 to 1000 Å may be deposited onto the gate insulation layer 4. The a-Si active layer includes an a-Si layer 5 and an n+a-Si layer 6 arranged on the a-Si layer 5. A photoresist may be applied onto the a-Si active layer, and then exposed and developed. Then, the a-Si active layer may be etched, and the remaining photoresist may be removed, so as to form the pattern of the a-Si active layer.

Figure 2:
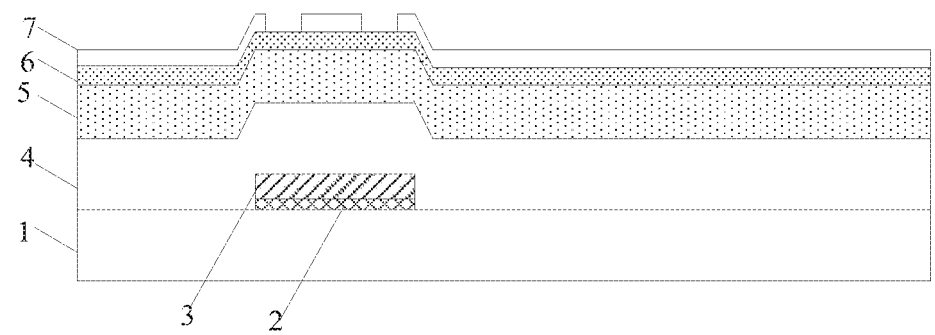
FIG. 2 is another schematic view showing the array substrate after the formation of via-holes penetrating through the etch stop layer according to one embodiment of the present disclosure.

Step c: forming a pattern of an etch stop layer 7 on the base substrate 1 obtained after Step b. To be specific, as shown in FIG. 1, the etch stop layer 7 having a thickness of 400 to 5000 Å may be deposited onto the base substrate obtained after Step b by magnetron sputtering, thermal evaporation, PECVD or any other film-forming method. The etch stop layer may be made of an oxide, a nitride or an oxynitride, and specifically it may be made of SiNx, SiOx or Si(ON)x. The etch stop layer 7 may be of a single-layered structure, or a double-layered structure consisting of a SiNx layer and a SiOx layer. Especially, the etch stop layer 7 may be a SiNx layer having a thickness of 3000 Å. Next, as shown in FIG. 2, a photoresist may be applied onto the etch stop layer 7, and then exposed with a mask plate, so as to form a photoresist reserved region corresponding to a region where the pattern of the etch stop layer 7 is located, and a photoresist unreserved region corresponding to the other region. Next, the photoresist may be developed, so as to fully remove the photoresist at the photoresist unreserved region and maintain a thickness of the photoresist at the photoresist reserved region. Then, the etch stop layer 7 at the photoresist unreserved region may be fully etched off and the remaining photoresist may be removed, so as to forming the pattern of the etch stop layer 7 with via-holes.

Figure 3:
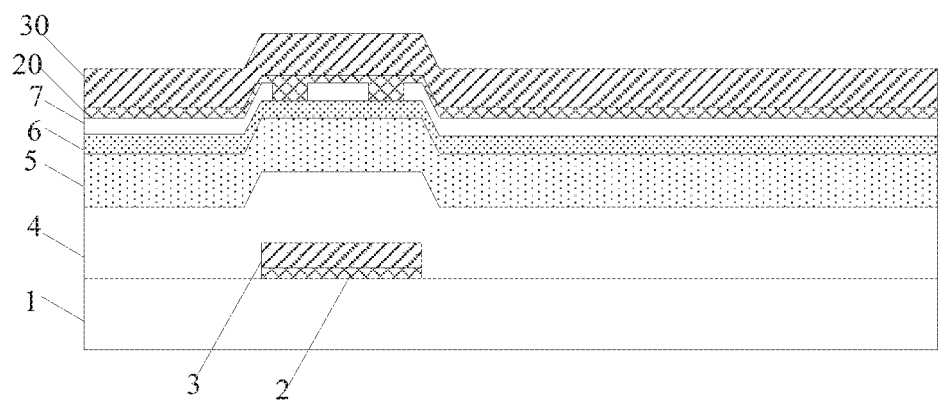
FIG. 3 is yet another schematic view showing the array substrate after the formation of a source/drain metal layer according to one embodiment of the present disclosure.
Figure 4:
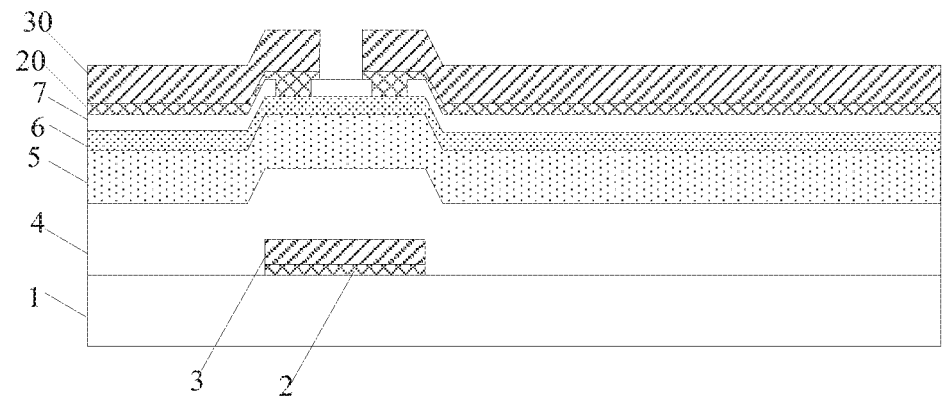
FIG. 4 is still yet another schematic view showing the array substrate after the formation of a source electrode and a drain electrode according to one embodiment of the present disclosure.

Step d: forming a data line, and a source electrode and a drain electrode of the TFT on the base substrate 1 obtained after Step c. To be specific, as shown in FIG. 3, a source/drain metal layer having a thickness of 2500 to 16000 Å may be deposited onto the base substrate 1 obtained after Step c by sputtering or thermal evaporation. The source/drain metal layer may be of a multi-layered structure consisting of two or more layers. In the embodiments of the present disclosure, the source/drain metal layer may include a Mo/Nb layer 20 and a Cu layer 30. The Mo/Nb layer 20 may be used to prevent the diffusion of Cu atoms in the Cu layer 30 into the a-Si active layer. Next, as shown in FIG. 4, a photoresist may be applied onto the source/drain metal layer, and then exposed with a mask plate, so as to form a photoresist reserved region corresponding to a region where a pattern of the source/drain metal layer is located, and a photoresist unreserved region corresponding to the other region. Next, the photoresist may be developed, so as to fully remove the photoresist at the photoresist unreserved region and maintain a thickness of the photoresist at the photoresist reserved region. Then, the source/drain metal layer at the photoresist unreserved region may be etched off and the remaining photoresist may be removed, so as to form the pattern of the source/drain metal layer. The pattern of the source/drain metal layer includes the data line, and the source electrode and the drain electrode of the TFT. The source electrode and the drain electrode are connected to the a-Si active layer through the via-holes in the etch stop layer 7.

In the embodiments of the present disclosure, the source/drain metal layer is etched by the HF-containing $H_2O_2$ etchant, and the etch stop layer 7 is arranged between the source/drain metal layer and the a-Si active layer. In the case that the source/drain metal layer is etched, it is able to protect the a-Si active layer through the etch stop layer. As a result, it is able to prevent the semiconductor characteristics of the a-Si active layer from being adversely affected by the HF-containing $H_2O_2$ etchant, thereby to ensure the performance of the TFT.

Figure 5:
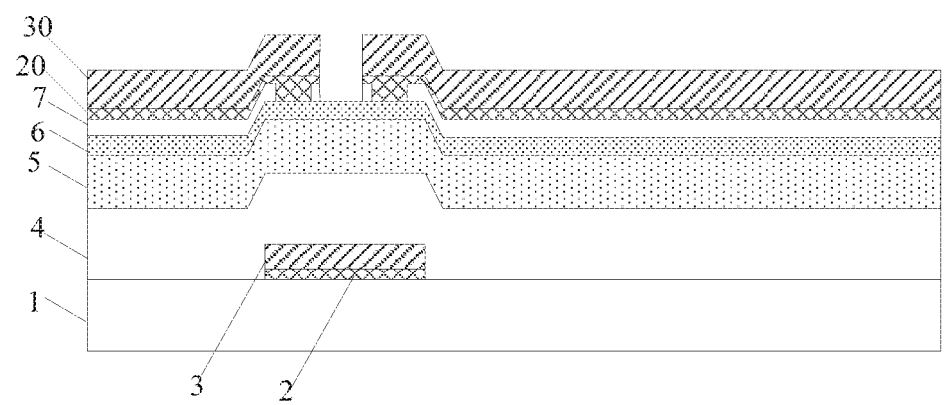
FIG. 5 is still yet another schematic view showing the array substrate after the removal of the etch stop layer at a position corresponding to a gap between the source electrode and the drain electrode according to one embodiment of the present disclosure.
Figure 6:
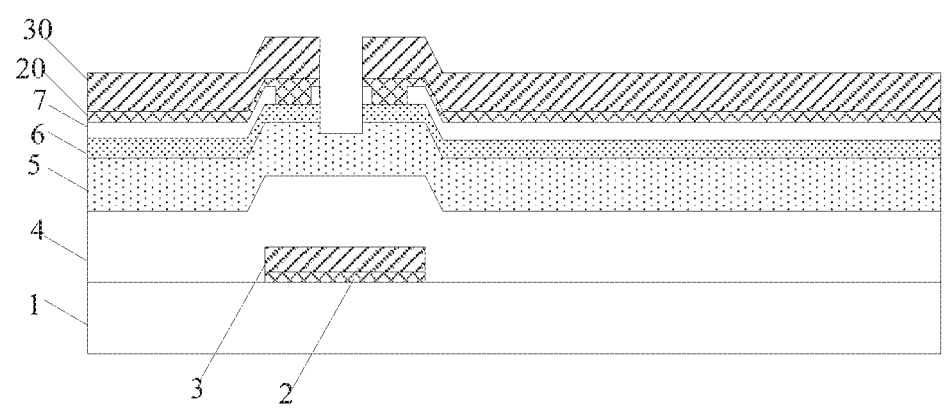
FIG. 6 is still yet another schematic view showing the array substrate after the removal of an n+a-Si layer and a part of an a-Si layer at a position corresponding to the gap between the source electrode and the drain electrode according to one embodiment of the present disclosure.

Step e: forming a channel of a TFT at a region corresponding to a gap between the source electrode and the drain electrode on the base substrate 1 obtained after Step d. To be specific, as shown in FIG. 5, the etch stop layer at the region corresponding to the gap between the source electrode and the drain electrode may be removed by a dry-etching process, so as to expose the a-Si active layer at a position corresponding to the region. Then, as shown in FIG. 6, the n+a-Si layer and a part of the a-Si layer at the position corresponding to the region may be etched off, so as to form the channel of the TFT. In the case that a gating signal is applied to the gate electrode of the TFT, the source electrode is electrically connected to the drain electrode through the channel.

Figure 7:
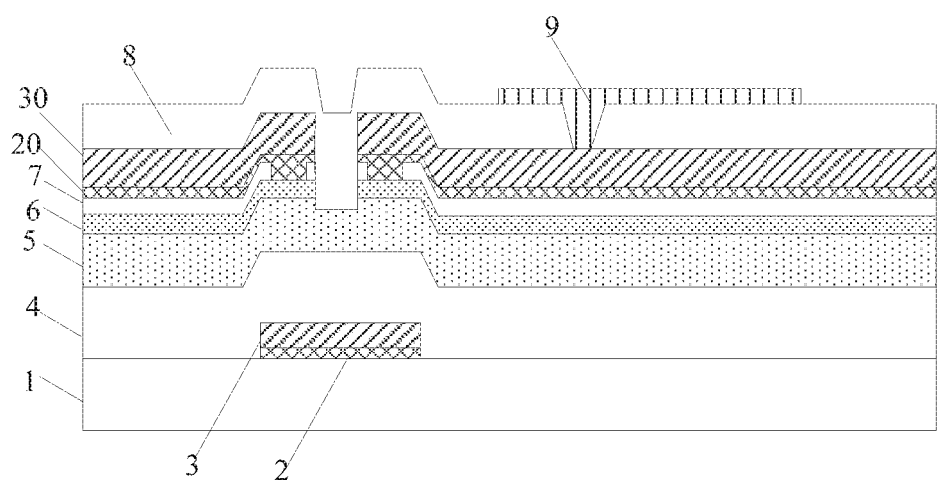
FIG. 7 is still yet other schematic view showing the array substrate after the formation of a passivation layer and a pixel electrode according to one embodiment of the present disclosure.

Step f: forming a passivation layer 8 and a pixel electrode 9 on the base substrate 1 obtained after Step e. To be specific, as shown in FIG. 7, the passivation layer 8 having a thickness of 400 to 5000 Å may be deposited onto the base substrate 1 obtained after Step e by magnetron sputtering, thermal evaporation, PECVD or any other film-forming method. In the embodiments of the present disclosure, the data line, the source electrode and the drain electrode are made of Cu, and a replacement reaction may easily occur between Si in SiOx and Cu to generate CuO, so the passivation layer may be made of SiNx. Next, a photoresist may be applied onto the passivation layer 8, and then exposed with a mask plate, so as to form a photoresist reserved region corresponding to a region where pattern of the passivation layer 8 is located, and a photoresist unreserved region corresponding to the other region. Next, the photoresist may be developed, so as to fully remove the photoresist at the photoresist unreserved region and maintain a thickness of the photoresist at the photoresist reserved region. Next, the passivation layer 8 at the photoresist unreserved region may be fully etched off and the remaining photoresist may be removed, so as to form the pattern of the passivation layer 8 with a via-hole. A transparent conductive layer having a thickness of about 20 to 1000 Å may be deposited onto the passivation layer 8 by magnetron sputtering, thermal evaporation and any other film-forming method. The transparent conductive layer may be made of indium tin oxide (ITO). Next, a photoresist may be applied onto the transparent conductive layer, and then exposed and developed. Then, the transparent conductive layer may be etched and the remaining photoresist may be removed, so as to form a pattern of the pixel electrode 9 made of the transparent conductive layer. The pixel electrode 9 is connected to the drain electrode of the TFT through the via-hole in the passivation layer.

The array substrate as shown in FIG. 7 may be obtained through the above-mentioned steps. It should be appreciated that, although the above description is given by taking the array substrate with a vertical electric field as an example, the present disclosure may also be applicable to the array substrate with a horizontal electric field or any other array substrate.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A thin film transistor (TFT), comprising a source electrode, a drain electrode and an a-Si active layer, wherein
    the source electrode and the drain electrode of the TFT are each of a first multi-layered structure comprising a first metal layer and a first metal barrier layer to prevent the a-Si active layer from being affected by an etchant when the metal barrier layer on the a-Si active layer is etched;
    the a-Si active layer of the TFT is covered with an etch stop layer;
    via-holes penetrating through the etch stop layer are provided at positions corresponding to the source electrode and the drain electrode; and
    the source electrode and the drain electrode are connected to the a-Si active layer through the via-holes.

2. The TFT according to claim 1, wherein a gate electrode of the TFT is of a second multi-layered structure comprising a second metal layer and a second metal barrier layer, which are made of materials identical to the first metal layer and the first metal barrier layer respectively.

3. The TFT according to claim 1, wherein the first multi-layered structure is a double-layered structure consisting of the metal layer and the metal barrier layer.

4. The TFT according to claim 2, wherein the first multi-layered structure is a double-layered structure consisting of the metal layer and the metal barrier layer, and the second multi-layered structure is a double-layered structure consisting of the second metal layer and the second metal barrier layer.

5. The TFT according to claim 1, wherein the first multi-layered structure is a triple-layered structure consisting of, one on top of the other, the first metal barrier layer, the first metal layer and a third layer made of Mo, Ti or Ta.

6. The TFT according to claim 2, wherein the first multi-layered structure is a triple-layered structure consisting of, one on top of the other, the first metal barrier layer, the first metal layer and a third layer made of Mo, Ti or Ta; and the second multi-layered structure is a triple-layered structure consisting of, one on top of the other, the second metal barrier layer, the second metal layer and a third layer made of Mo, Ti or Ta.

7. The TFT according to claim 1, wherein the first metal layer is made of Cu.

8. The TFT according to claim 1, wherein the first metal barrier layer is made of Ti, Mo or an alloy of Mo and Nb.

9. The TFT according to claim 1, wherein the a-Si active layer comprises an a-Si layer and an n+a-Si layer arranged on the a-Si layer.

10. The TFT according to claim 9, wherein the n+a-Si layer is made of Phosphorus-doped Si.

11. An array substrate, comprising a base substrate and the TFT according to claim 1 formed on the base substrate.

12. The array substrate according to claim 11, wherein a data line and/or a gate line of the array substrate are each of a third multi-layered structure including a third metal layer and a third metal barrier layer, which are made of materials identical to the first metal layer and the first metal barrier layer respectively.

13. A display device, comprising the array substrate according to claim 11.

14. A method for manufacturing a thin film transistor (TFT), comprising steps of:
    forming a pattern of an etch stop layer on an a-Si active layer of the TFT, via-holes penetrating through the etch stop layer being provided at positions corresponding to a source electrode and a drain electrode of the TFT; and
    forming the source electrode and the drain electrode of the TFT using a first multi-layered structure including a first metal layer and a first metal barrier layer to prevent the a-Si active layer from being affected by an etchant when the metal barrier layer on the a-Si active layer is etched, the source electrode and the drain electrode being connected to the a-Si active layer through the via-holes respectively.

15. The method according to claim 14, further comprising:
    forming a gate electrode of the TFT using a second multi-layered structure including a second metal layer and a second metal barrier layer, which are made of materials identical to the first metal layer and the first metal barrier layer respectively.

16. The method according to claim 14, wherein the step of forming the a-Si active layer, the source electrode and the drain electrode comprises:
    forming a double-layered structure consisting of an a-Si layer and an n+a-Si layer, and patterning the double-layered structure to form a pattern of the a-Si active layer;
    forming the etch stop layer on the a-Si active layer, and patterning the etch stop layer to form the via-holes penetrating through the etch stop layer at positions corresponding to the source electrode and the drain electrode; and
    depositing the first multi-layered structure including the first metal layer and the first metal barrier layer onto the etch stop layer, applying a photoresist onto the first multi-layered structure, exposing and developing the photoresist to form a photoresist reserved region and a photoresist unreserved region, and etching the first multi-layered structure at the photoresist unreserved region with an HF-containing $H_2O_2$ etchant to form the source electrode and the drain electrode, which are connected to the a-Si active layer through the via-holes.

17. The method according to claim 16, wherein subsequent to the step of forming the source electrode and the drain electrode, the method further comprises:
   removing the etch stop layer at a region corresponding to a gap between the source electrode and the drain electrode by a dry-etching process, so as to expose the a-Si active layer at a position corresponding to the region; and
   etching off the n+a-Si layer and a part of the a-Si layer at the position corresponding to the region, so as to form a channel of the TFT.

18. The method according to claim 14, wherein the first metal layer is made of Cu, and the first metal barrier layer is made of Ti, Mo, or an alloy of Mo and Nb.

19. A method for manufacturing an array substrate, comprising a step of forming a thin film transistor (TFT) on a base substrate using the method according to claim 14.

20. The method according to claim 19, further comprising:
   forming a data line and/or a gate line of the array substrate using a third multi-layered structure including a third metal layer and a third metal barrier layer, which are made of materials identical to the first metal layer and the first metal barrier layer respectively.

* * * * *